US007755175B2

(12) United States Patent
Ishida et al.

(10) Patent No.: US 7,755,175 B2
(45) Date of Patent: Jul. 13, 2010

(54) MULTI-STACK CHIP PACKAGE WITH WIRED BONDED CHIPS

(75) Inventors: Katsuhiro Ishida, Yokkaichi (JP); Ryoji Matsushima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 11/555,902

(22) Filed: Nov. 2, 2006

(65) Prior Publication Data

US 2007/0102801 A1 May 10, 2007

(30) Foreign Application Priority Data

Nov. 10, 2005 (JP) ............................. 2005-325901

(51) Int. Cl.
*H01L 23/495* (2006.01)
*H01L 21/00* (2006.01)
*H01R 9/00* (2006.01)

(52) U.S. Cl. .................. 257/672; 257/692; 257/784; 257/E23.031; 257/E23.39; 257/E23.043; 257/E23.052; 361/772; 361/813; 438/123

(58) Field of Classification Search ................ None
See application file for complete search history.

(56) References Cited

U.S. PATENT DOCUMENTS

| 5,495,398 | A | * | 2/1996 | Takiar et al. ................ 361/790 |
| 6,065,667 | A | * | 5/2000 | Singh ....................... 228/180.5 |
| 6,316,838 | B1 | * | 11/2001 | Ozawa et al. ............... 257/778 |
| 6,426,563 | B1 | * | 7/2002 | Fujihira ..................... 257/780 |
| 6,433,421 | B2 | * | 8/2002 | Masuda et al. .............. 257/723 |
| 6,476,506 | B1 | * | 11/2002 | O'Connor et al. ........... 257/786 |
| 6,498,391 | B1 | * | 12/2002 | Huang et al. ................ 257/676 |
| 6,621,155 | B1 | * | 9/2003 | Perino et al. ................ 257/686 |
| 6,727,579 | B1 | | 4/2004 | Eldridge et al. |
| 6,778,406 | B2 | | 8/2004 | Eldridge et al. |
| 6,812,575 | B2 | * | 11/2004 | Furusawa ................... 257/774 |
| 7,021,520 | B2 | * | 4/2006 | Bowen ..................... 228/180.5 |
| 7,339,257 | B2 | * | 3/2008 | Ozawa et al. ............... 257/666 |
| 7,420,287 | B2 | * | 9/2008 | Smushkovich .............. 290/42 |
| 2003/0230796 | A1 | * | 12/2003 | Ismail et al. ................ 257/686 |
| 2004/0164392 | A1 | | 8/2004 | Lee |

FOREIGN PATENT DOCUMENTS

| JP | 11-135714 | 5/1999 |
| JP | 2003-243442 | 8/2003 |

* cited by examiner

*Primary Examiner*—Alonzo Chambliss
(74) *Attorney, Agent, or Firm*—Oblon, Spivak, McClelland, Maier & Neustadt, L.L.P.

(57) ABSTRACT

A stack-type semiconductor device according to the present invention includes a circuit board with bonding pads; a first semiconductor chip which includes first electrode pads and is mounted on the circuit board; a second semiconductor chip which includes second electrode pads and is mounted on the first semiconductor chip; a plurality of bonding wires sequentially connecting the bonding pads, the first electrodes and the second electrodes as a whole; and a sealing resin for sealing the first semiconductor chip, the second semiconductor chip and the bonding wires.

12 Claims, 8 Drawing Sheets

MULTI-STACK CHIP PACKAGE WITH WIRED BONDED CHIPS

CROSS-REFERENCE TO RELATED APPLICATIONS

This application is based upon and claims the benefit of priority from the prior Japanese Patent Application No. 2005-325901 filed on Nov. 10, 2005; the entire contents which are incorporated herein by reference.

BACKGROUND

1. Field of the Invention

The present invention relates to a stack-type semiconductor device in which a plurality of semiconductor elements are stacked, and to a method of manufacturing the same.

2. Description of the Related Art

In order to realize downsizing, higher-density packaging and the like of a semiconductor device, a stack-type multichip package in which a plurality of semiconductor elements are stacked and sealed in one package has been in practical use in recent years. In the stack-type multichip package, the plural semiconductor elements are stacked in sequence on a circuit board via an adhesive film. Electrode pads of the semiconductor elements are electrically connected to electrode parts of the circuit board via bonding wires. Such a stacked structure is packaged by sealing resin, whereby the stack-type multichip package is formed.

In a memory device utilizing NAND type flash memories, for example, a plurality of memory chips are stacked on a lead frame and sealed so as to develop the memory capacity of the memory device. In such a stack-type memory device as described above, the bonding wires to connect the top layer semiconductor chip electrode and the lead frame are inevitably too long. As a result, the bonding wires are flowed at the wire bonding process and/or the resin sealing process so that the adjacent bonding wires with the respective different electric potentials may be contacted with one another and short-circuited. In this point of view, the reliability of the stack-type memory device can not be enhanced. Moreover, the wire bonding design becomes difficult and the design allowable range is restricted so that the stack-type memory device can not be commercially available.

In view of the problem as described above, in such a semiconductor device as a NAND-type flash memory or the like, such a semiconductor chip structure is proposed as connecting the electrode pads with the same electric potential as one another of the semiconductor chips and the lead frame with bonding wires (refer to Patent Publications No. 1 and 2). In the semiconductor chip structure, the electrode pads of the top semiconductor chip are bonded to the electrode pads of the lower semiconductor chip with bonding wires. Stud bumps are formed at the corresponding electrode pads of the lower semiconductor chip in advance. Then, the electrode pads of the lower semiconductor chip are bonded to the lead frame with bonding wires. In this way, the electrode pads of the semiconductor chips with the same electric potential as one another can be bonded to the lead frame via the lower semiconductor chip(s).

With such a conventional semiconductor chip structure as described above, however, at least twice bonding steps are required for the electrode pads of the semiconductor chips via the bonding wires. In this case, since supersonic vibration is applied to the electrode pads of the semiconductor chips at the wire bonding process, the bonding wires may be deformed and the electric connection between the electrode pads of the semiconductor chips may be failed, resulting in the lower productive yield of the stack-type semiconductor device. Moreover, the bonding number of times for the electrode pads of the semiconductor chips is increased at the wire bonding process so that the manufacturing steps is increased and the productive efficiency is lowered.

[Patent Document 1] JP-A 11-135714
[Patent Document 2] JP-A 2003-243442

SUMMARY

An aspect of the present invention relates to A stack-type semiconductor device, comprising: a circuit board with bonding pads; a first semiconductor chip which includes first electrode pads and is mounted on the circuit board; a second semiconductor chip which includes second electrode pads and is mounted on the first semiconductor chip; a plurality of bonding wires sequentially connecting the bonding pads, the first electrodes and the second electrodes as a whole; and a sealing resin for sealing the first semiconductor chip, the second semiconductor chip and the bonding wires.

Another aspect of the present invention relates to a method for manufacturing a stack-type semiconductor device, comprising: stacking and mounting, on a circuit board with bonding pads, a first semiconductor chip with first electrode and a second semiconductor chip with second electrode pads; and wire-bonding with wires the bonding pads, the first electrode pads and the second electrode pads as a whole.

DETAILED DESCRIPTION

Hereinafter, embodiments of the present invention will be described with reference to the drawings. The drawings, though referred to in describing the embodiments of the present invention, are provided only for an illustrative purpose and in no way limit the present invention.

Figure 1A:
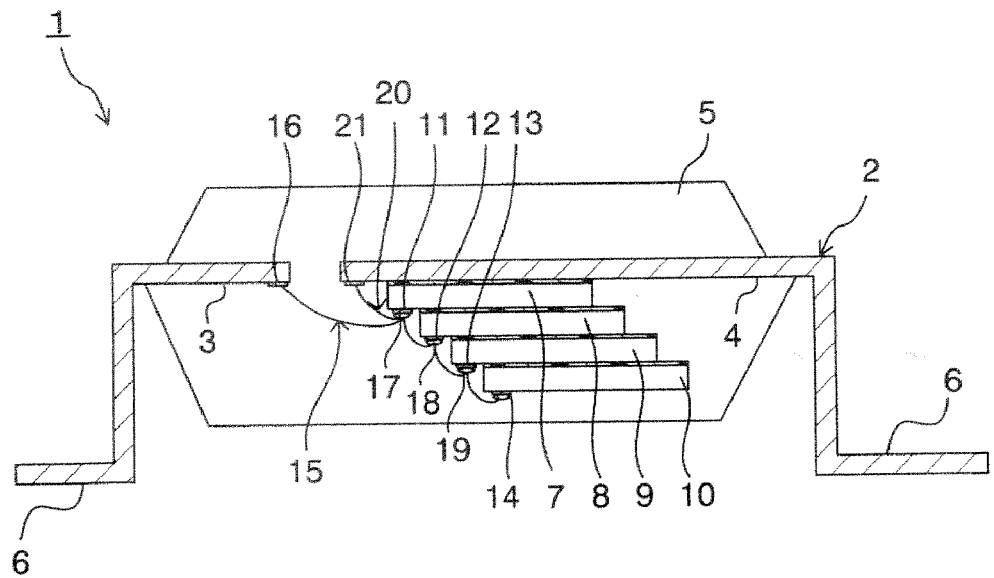
FIG. 1A is a cross-sectional view schematically showing the structure of a stack-type semiconductor device according to a first embodiment of the present invention.
Figure 1B:
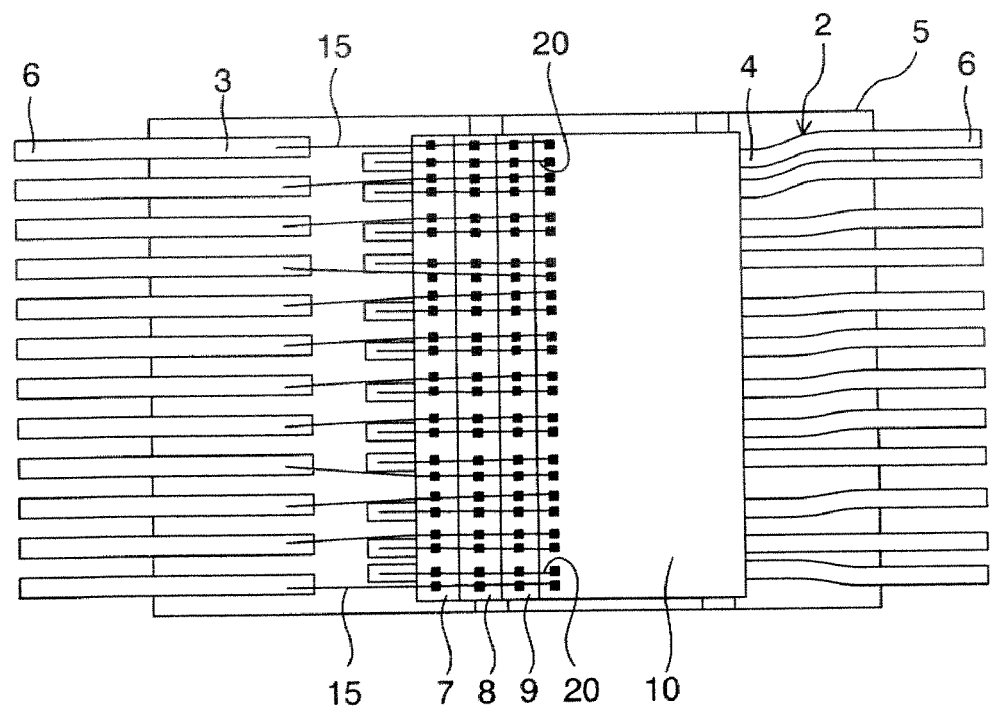
FIG. 1B is a plan view of the structure of the stack-type semiconductor device as shown in FIG. 1A, as viewed from the backside of the semiconductor device under the state without a sealing resin.

FIG. 1A is a cross-sectional view schematically showing the structure of a stack-type semiconductor device according to a first embodiment of the present invention, and FIG. 1B is a plan view of the structure of the stack-type semiconductor device as shown in FIG. 1A, as viewed from the backside of the semiconductor device under the state without a sealing resin. In this embodiment, the stack-type semiconductor device 1 is directed at a TSOP (Thin Small Outline Package) structured semiconductor device in which four semiconductor chips are stacked and packaged under the face-down condition. The stack-type semiconductor device 1 shown in FIGS. 1 includes a lead frame 2 as a circuit board. Instead of the lead frame, another circuit board may be employed.

The lead frame 2 includes first inner leads 3 and second inner leads 4 which have the respective different lengths, and outer leads 6 which are continued from the inner leads 3 and 4 through a sealing resin 5. The inner leads 3 and 4 are not depressed so that the surface levels of the inner leads 3 and 4 are equal to one another. At the inner leads 4 are provided a chip mounting area for mounting a first semiconductor chip 7

The first semiconductor chip 7 includes first electrode pads 11 along one side of the element forming surfaces thereof so as to constitute a one-sided pad structured semiconductor chip, and are adhered on the chip mounting area of the second inner leads 4 via a filmy insulating adhesive with a thickness of 20 to 40 μm. As the insulating adhesive may be employed a filmy insulating adhesive attached to the backside of a wafer at the dicing process for individually separating chips from the wafer. The use of the insulating adhesive leads to the high electric insulation between the first semiconductor chip 7 and the chip mounting area and thus, the high reliability.

On the first semiconductor chip 7 are stepwise formed a second through fourth semiconductor chips 8-10 in turn via filmy insulating adhesives so that the edges of the semiconductor chips 8-10 are exposed On the exposed edges of the second through fourth semiconductor chips 8-10 are formed a second through fourth electrode pads 12-14 so as to be parallel to the first electrode pad 11. In this embodiment, the electrode pads are disposed on the long side edges of the corresponding semiconductor chips, but the arrangement of the electrode pads is not limited to this embodiment. For example, the electrode pads may be disposed on the short side edges of the corresponding semiconductor chips.

The first bonding wires 15 may be made of metal wires (e.g., Au wires), and electrically connects the first through fourth electrode pads 11-14 to first bonding pads 16 of the first inner leads 3 In this case, the electrode pads 11-14 are electrically connected in turn via stud bumps 17-19 which are formed on the corresponding electrode pads 11-14 and then, electrically connected to the first bonding pads 16 via the first bonding wires 15. In other words, one ends of the first bonding wires 15 are ball-bonded to the fourth electrode pads 14 and the other ends of the first bonding wires 15 are stitch-bonded to the first bonding pads 16. Then, the intermediate portions of the first bonding wires 15 are also stitch-bonded to the stud bumps 17-19 which are formed on the first through third electrode pads 11-13. The stud bumps 17-19 are formed with a wire bonding machine which is used in the formation of the bonding wires 15 and made of the same material as the bonding wires 15 (e.g., Au).

Second bonding wires 20 may be made of metal wires (e.g., Au wires), and electrically connects the first through fourth electrode pads 11-14 to second bonding pads 21 of the second inner leads 4. In this case, the electrode pads 11-14 are electrically connected in turn via stud bumps 17-19 which are formed on the corresponding electrode pads 11-14 and then, electrically connected to the second bonding pads 21 via the second bonding wires 20. In other words, one ends of the second bonding wires 20 are ball-bonded to the fourth electrode pads 14 and the other ends of the first bonding wires 15 are stitch-bonded to the second bonding pads 21. Then, the intermediate portions of the second bonding wires 20 are also stitch-bonded to the stud bumps 17-19 which are formed on the first through third electrode pads 11-13. The first bonding wires 15 and the second bonding wires 20 are configured to connect the electrodes with the same electric characteristics and signal characteristics as one another.

The first through fourth semiconductor chips 7-10, which are stacked in turn and disposed as designed as described above, the first bonding wires 15, and the second bonding wires 20 are sealed with the sealing resin 5 such as epoxy resin so as to constitute the stack-type semiconductor device 1 with the TSOP structure. In this embodiment, the stack number of semiconductor chip is set to four, but may be set to another stack number, e.g., two, three or five and more.

Figure 2A:
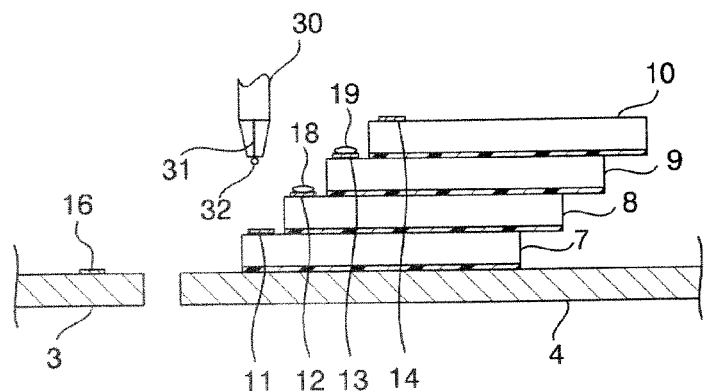
FIGS. 2A, 2B and 2C are cross-sectional views schematically showing a wire bonding process of first bonding wires in a manufacturing process of the stack-type semiconductor device as shown in FIG. 1.
Figure 2B:
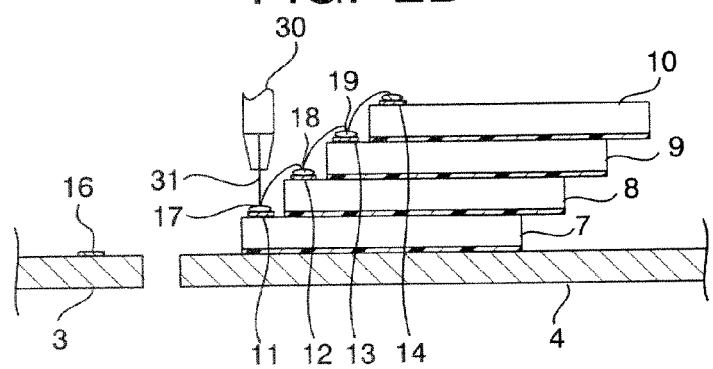
Figure 2C:
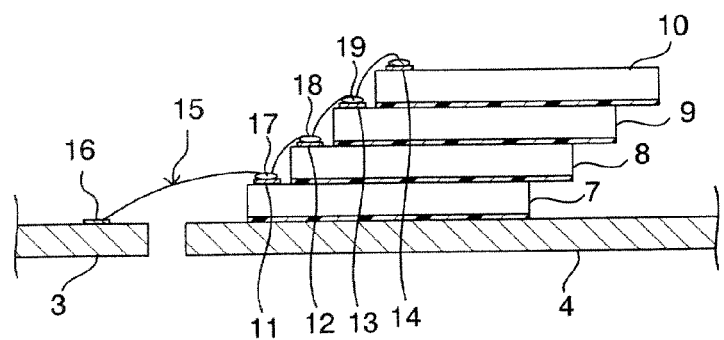

The stack-type semiconductor device 1 may be manufactured as follows. FIGS. 2A, 2B and 2C are cross-sectional views schematically showing a wire bonding process of the first bonding wires in the manufacturing process of the stack-type semiconductor device as shown in FIG. 1.

First of all, the first though fourth semiconductor chips 7-10 are stacked in turn on the chip mounting area of the second inner leads 4 via filmy insulating adhesives so that the electrode pads 11-14 are almost parallel to one another, thereby to be packaged.

Then, as shown in FIG. 2A, the stud bumps 17-19 are formed on the corresponding electrode pads 11-13 of the first through third semiconductor chips 7-9 by means of a capillary 30. At the center of the capillary 30 is formed an inserting hole for inserting a wire 31 made of Au, etc. Then, a ball portion 32 is formed at the forefront of the wire 31 projecting from the inserting hole of the capillary 30 by means of spark discharge or the like, pressed against the third electrode pads 13 under a predetermined pressure (load) and bonded to the electrode pads 13 by means of the supersonic vibration of the capillary 30. Then, the wire 31 is pulled up and released with the capillary 30 so that the stud bumps 19 are formed on the third electrode pads 13. It is desired that the size of the stud bumps 19 is set to a predetermined value, e.g., about 60 μm by adjusting the current and the duration of the spark discharge. The stud bumps 17 and 18 are formed on the first electrode pads 11 and the second electrode pads 12, respectively in the same manner as the stud bumps 19.

The capillary 30 with the ball portion 32 formed by the spark discharge is shifted on the fourth electrode pads 14, and the ball portion 32 at the forefront of the capillary 30 is pressed against the fourth electrode pads 14 under a predetermined pressure so as to be ball-bonded to the fourth electrode pads 14 by means of the supersonic vibration of the capillary 30.

After the ball-bonding for the fourth electrode pads 14 is conducted, as shown in FIG. 2B, the capillary 30 is shifted on the stud bumps 19 of the third semiconductor chip 9 under the condition that the wire 31 is projected from the capillary 30. Then, the wire 31 is pressed against the stud bumps 19 to be stitch-bonded, if needed, by means of the supersonic vibration of the capillary 30. The stud bumps 18 and 17 of the second electrodes 12 and the first electrodes 11 and the first bonding pads 16 of the first inner leads 3 are stitch-bonded in the same manner as described above. In order to mitigate the damages for the electrode pads 13-11, the drop down velocity of the capillary 30 is preferably set to a lower value so as to conduct the soft landing.

Then, as shown in FIG. 2C, the first bonding wires 15 are wire-bonded to the fourth electrode pads 14 and the first bonding pads 16 so that the intermediate portions of the wires 15 are bonded to the third through first electrode pads 13-11.

Thereafter, the second bonding wires 20 are wire-bonded to the fourth electrode pads 14 and the second bonding pads 21 of the second inner leads 4 so that the intermediate portions of the wires 20 are bonded to the third through first electrode pads 13-11. In this case, after the second bonding wires 20 are bonded to the fourth electrode pads 14, the second bonding wires 20 are bonded to the stud bumps of the third through first electrode pads 13-11 and the second bonding pads 21.

The first through fourth semiconductor chips 7-10, which are stacked in turn and disposed as designed as described above, the first bonding wires 15, and the second bonding wires 20 are sealed with the sealing resin 5 such as epoxy resin so as to constitute the stack-type semiconductor device 1.

In this embodiment, the stack-type semiconductor device 1 includes the four semiconductor chips 7-10 which are packaged under the face-down condition. Therefore, even though laser light is irradiated onto the top surface of the package (the package surface of the lead frame on which no chip is mounted) to conduct the marking for the package in the product fabricating process, the semiconductor chips 7-10 and the bonding wires 15-16 are not damaged by the laser light.

In this embodiment, since the semiconductor chips 7-10 include the corresponding electrode pads 11-14 which are disposed along the corresponding one sides of the element forming surfaces thereof, the total chip size can be reduced. For example, in a memory chip such as a NAMD type flash memory, the surface area of the memory chip can be changed in accordance with the layout design of around circuits for streamlining the circuit design. According to the one-sided pad structure of this embodiment in which the semiconductor chips 7-10 are disposed along the one side of the device, since the wiring design around the pads and circuits can be streamlined, the chip surface of the device can be downsized. Therefore, the semiconductor chips 7-10 are preferable for a low cost stack-type semiconductor device such as a NAND type flash memory.

In this embodiment, since the first bonding wires 15 and the second bonding wires 20 are wire-bonded to the fourth electrode pads 14 and the bonding pads 16, 21 so that the intermediate portions of the wires 15, 20 are bonded to the stud bumps 19-17 which are formed on the corresponding third through first electrode pads 13-11, the length of the bonding wires 15, 20 can be shortened so as to lower the loop height of the bonding wires 15, 20. As a result, when the semiconductor chips 7-10 and the bonding wires 15, 20 are sealed by the sealing resin 5, the short circuit between the bonding wires 15 and 20 can be prevented due to the contact thereof when the wires 15 and 20 are flowed. In this point of view, the reliability of the stack-type semiconductor device can be enhanced.

In this embodiment, the stud bumps 17-19 of the electrode pads 11-13 are subsequently bonded so that the wire bonding process is conducted only once. In the electrode pads 11-13, the wire deformation and the connecting failure due to the supersonic vibration at the wire bonding process can be prevented so that the intended stack-type semiconductor device can be manufactured easily and efficiently.

Figure 3A:
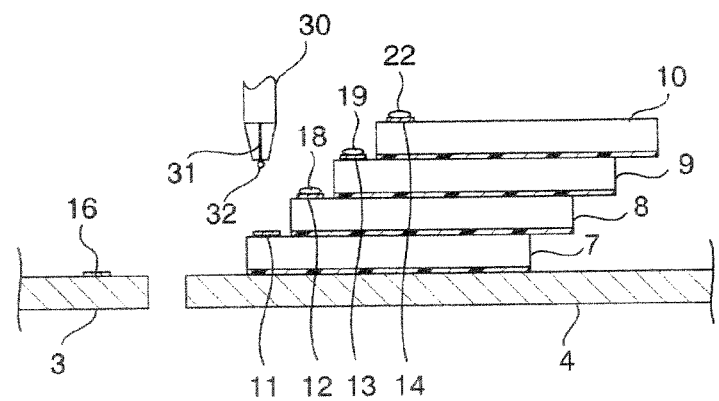
FIGS. 3A, 3B and 3C are cross-sectional views schematically showing another wire bonding process of first bonding wires in a manufacturing process of the stack-type semiconductor device as shown in FIG. 1.
Figure 3B:
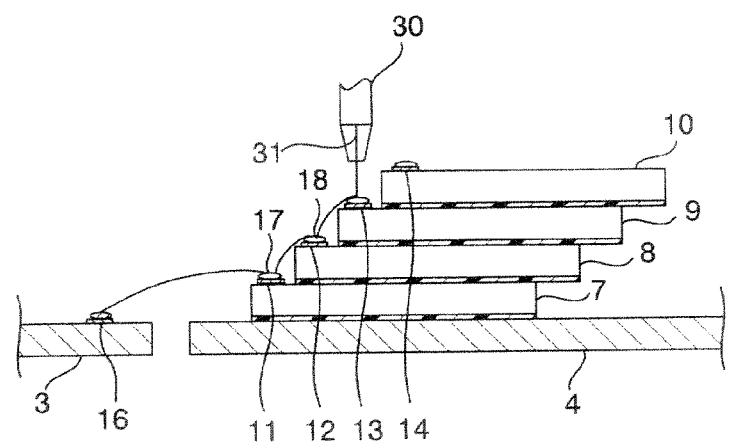
Figure 3C:
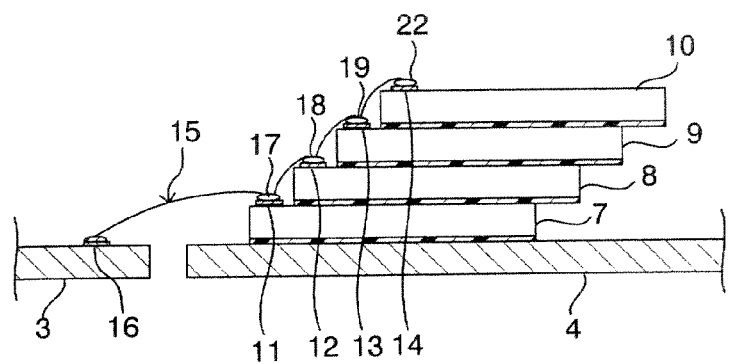

In this embodiment, in the wire bonding process of the first bonding wires 15, after the fourth electrode pads 14 are ball-bonded, the stud bumps 19-17 formed on the corresponding third through first semiconductor chips are subsequently stitch-bonded and then, the first bonding pads 16 are bonded. In the present invention, however, the bonding turn is not limited to this embodiment as described above. For example, as shown in FIGS. 3A, 3B and 3C, it may be that after the stud bumps 17, 18, 19, 22 are formed on the electrode pads 11, 12, 13, 14 of the semiconductor chips 7, 8, 9, 10 (refer to FIG. 3A), the first bonding pads 16 of the first inner leads 3 are ball-bonded and the stud bumps 17,18, 19 are subsequently stitch-bonded (refer to FIG. 3B), and the stud bumps 22 of the fourth semiconductor chip 10 are bonded (refer to FIG. 3C).

Figure 4:
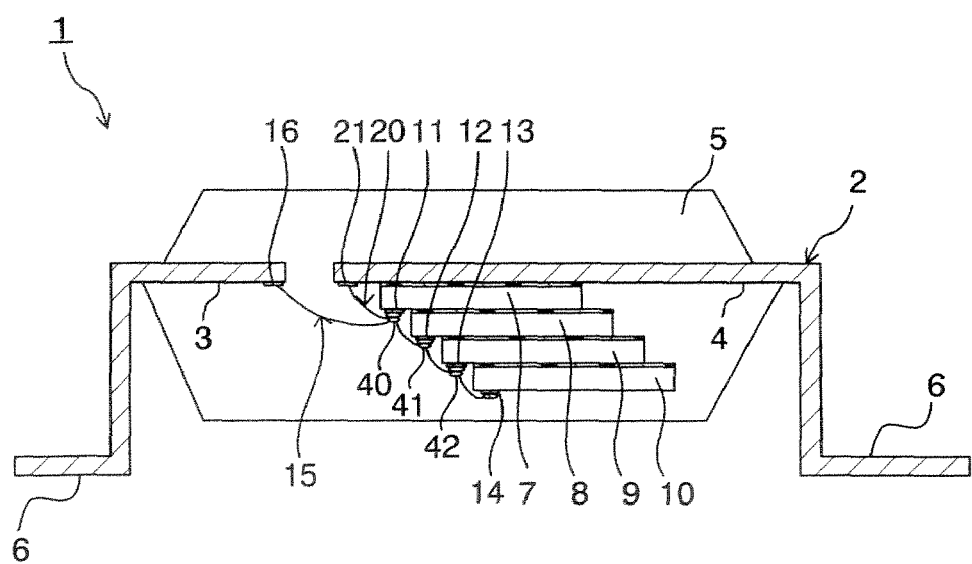
FIG. 4 is a cross-sectional view schematically showing the structure of a stack-type semiconductor device modified from the one as shown in FIG. 1.

Moreover, as shown in FIG. 4, after the first bonding wires 15 and/or the second bonding wires 20 are formed, stud bumps 40, 41, 42 may be formed on the stud bumps 17, 18, 10 so as to unfailingly connect the wires 15, 20 to the stud bumps 17, 18, 19.

Figure 5:
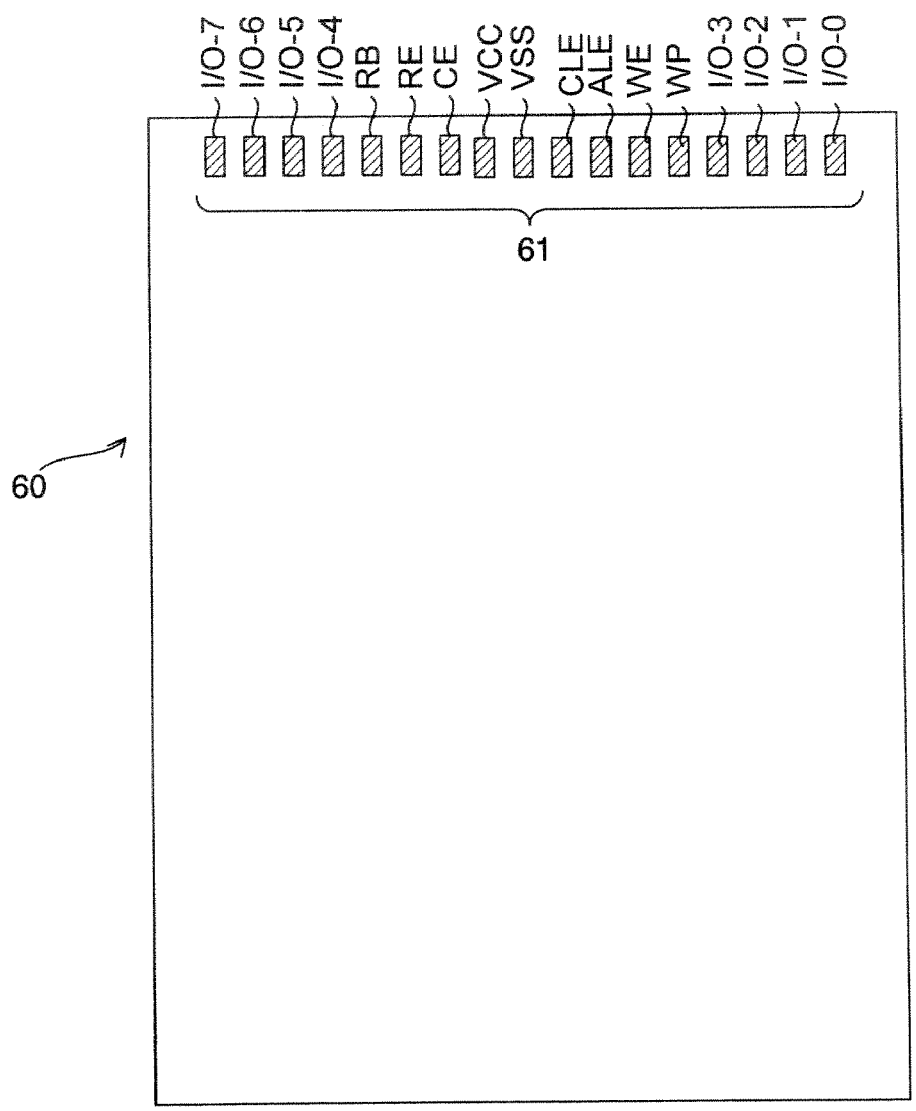
FIG. 5 is a structural view showing a NAND flash memory to be employed as a semiconductor chip in a stack-type semiconductor device according to a second embodiment of the present invention.

FIG. 5 is a structural view showing a stack-type semiconductor device according to a second embodiment of the present invention. In this embodiment, the stack-type semiconductor device is directed at a NAND-type flash memory to be packaged. In this embodiment, the stack-type semiconductor device 1 includes the four semiconductor chips which are stacked and packaged under the face-down condition as the first embodiment except the connecting structure of bonding wires. Like reference numerals are imparted to like components throughout the drawings relating to the first embodiment and the second embodiment. In this point of view, the explanation for like components will be omitted or simplified.

As shown in FIG. 5, the memory chip 60 includes 17 electrode pads 61 to which external terminals for power unit and input/output signal which are designated by VCC, VSS, I/O-0~I/O-7, RB, RE are allotted and external terminals for control which are designated by CE, CLE, ALE, WE, WP are also alloted.

The electrode pads to which the external terminal VCC are allotted are pads for power source voltage (VCC) input for supplying the power source voltage (VCC) The electrode pads to which the external terminals I/O-0~I/O-7 are allotted are input/output pads for inputting/outputting address, command, and input/output data. The electrode pad to which the external terminal RE is allotted is an output pad for serial-outputting data. The electrode pad to which the external terminal RB is allotted is an output pad for indicating the inner operation condition to the outside.

The electrode pad to which the external terminal CE is allotted is an input pad for inputting device selecting signal. The electrode pad to which the external terminal CLE is allotted is an input pad for inputting a control signal for an operation command to an inner command resistor (not shown) built in the device. The electrode pad to which the external terminal ALE is allotted is an input electrode for inputting control signals for address data input and data input into the corresponding address resistor and the data resistor (not shown) built in the device. The electrode pad to which the external signal WE is allotted is an input pad for inputting control signal for data input into the device from the I/O terminals. The electrode pad to which the external terminal WP is allotted is an input pad for inputting signal to prevent the writing/erasing operation on a mandatory basis.

Figure 6:
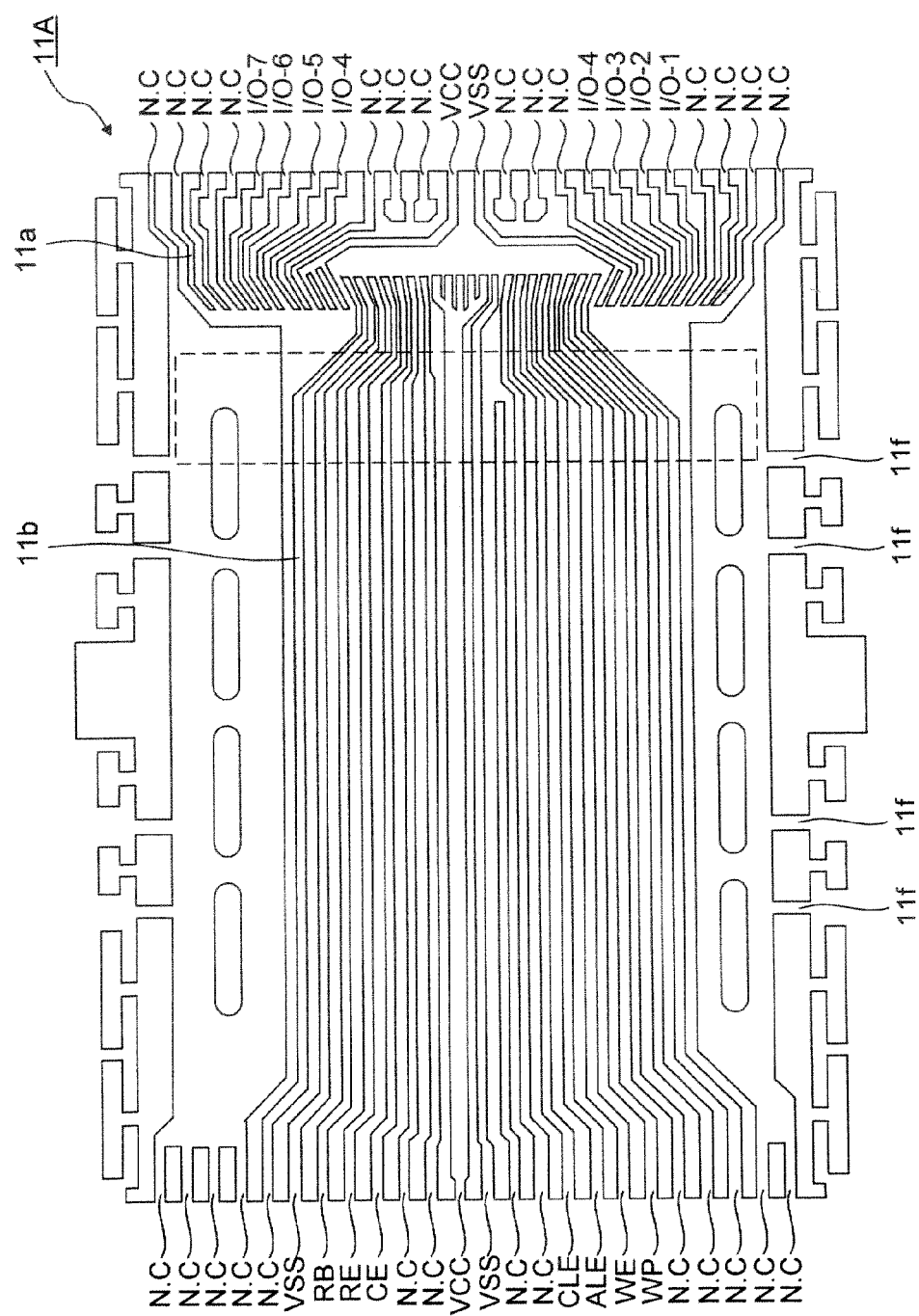
FIG. 6 is a plan view showing a lead frame to be employed in the stack-type semiconductor device according to the second embodiment of the present invention.

An example for the lead frame employed in this embodiment will be described with reference to FIG. 6. FIG. 6 is a plan view showing the lead frame to be employed in the stack-type semiconductor device of this embodiment. In FIG. 6, a lead frame 2A is illustrated in which the lateral positional relation relating to the first inner leads 3 and the second inner leads 4 of the lead frame in the first embodiment is reversed.

To the bonding pads (not shown) of the first inner leads 3 and the second inner leads 4 are allotted the external terminals VCC, VSS, I/O-0~I/O-7, RB, CE, RE, CLE, ALE, WE, WP in the same manner as the electrode pads 61 of the NAND-type flash memory 60 Herein, the reference numeral "N.C" designates the condition of nonuse.

In the lead frame 2A, the forefronts of the second inner leads 4 are arranged around the center in the width direction of the lead frame 2A so that the forefronts of the first inner leads 3 are arranged outside the forefronts of the second inner leads 4. Since it is difficult to bend the first inner leads 3 remarkably, it is desired that the forefronts of the first inner leads 3 are arranged as described above. In contrast, since the bending freedom of the second inner leads 4 is relatively large, the forefronts of the second inner leads 4 are arranged around the center in the width direction as described above.

The stack-type semiconductor device in this embodiment includes a third through sixth bonding wires (not shown).

One ends of the third bonding wires are ball-bonded to the fourth electrode pads 14 to which the external terminals VCC, VSS, I/O-0~I/O-7 of the memory chip 60 as shown in FIG. 5 are allotted, and other ends of the third bonding wires are stitch-bonded to the corresponding bonding pads of the first inner leads 3 as shown in FIG. 6. The intermediate portions of the third bonding wires are stitch-bonded to the stud bumps 17, 18, 19 formed on the first, second and third electrode pads 11, 12, 13 to which the external terminals VCC, VSS, I/O-0~I/O-7 are allotted.

one ends of the fourth bonding wires are ball-bonded to the fourth electrode pads 14 to which the external terminals RB, RE of the memory chip 60 as shown in FIG. 5 are allotted, and other ends of the fourth bonding wires are stitch-bonded to the corresponding bonding pads of the first inner leads 3 as shown in FIG. 6. The intermediate portions of the fourth bonding wires are stitch-bonded to the stud bumps 17, 18, 19 formed on the first, second and third electrode pads 11, 12, 13 to which the external terminals RB, RE are allotted.

One ends of the fifth bonding wires are ball-bonded to the first through fourth electrode pads 11-14 to which the external terminals CE, WP, ALE, CLE of the memory chip 60 as shown in FIG. 5 are allotted, and other ends of the fifth bonding wires are stitch-bonded to the corresponding bonding pads of the second inner leads 4 as shown in FIG. 6. The intermediate portions of the fifth bonding wires are not stitch-bonded to the stud bumps 17, 18, 19 so that the fifth bonding wires are bonded to the first through fourth bonding pads and the bonding pads 21 directly not via the stud bumps.

Figure 7:
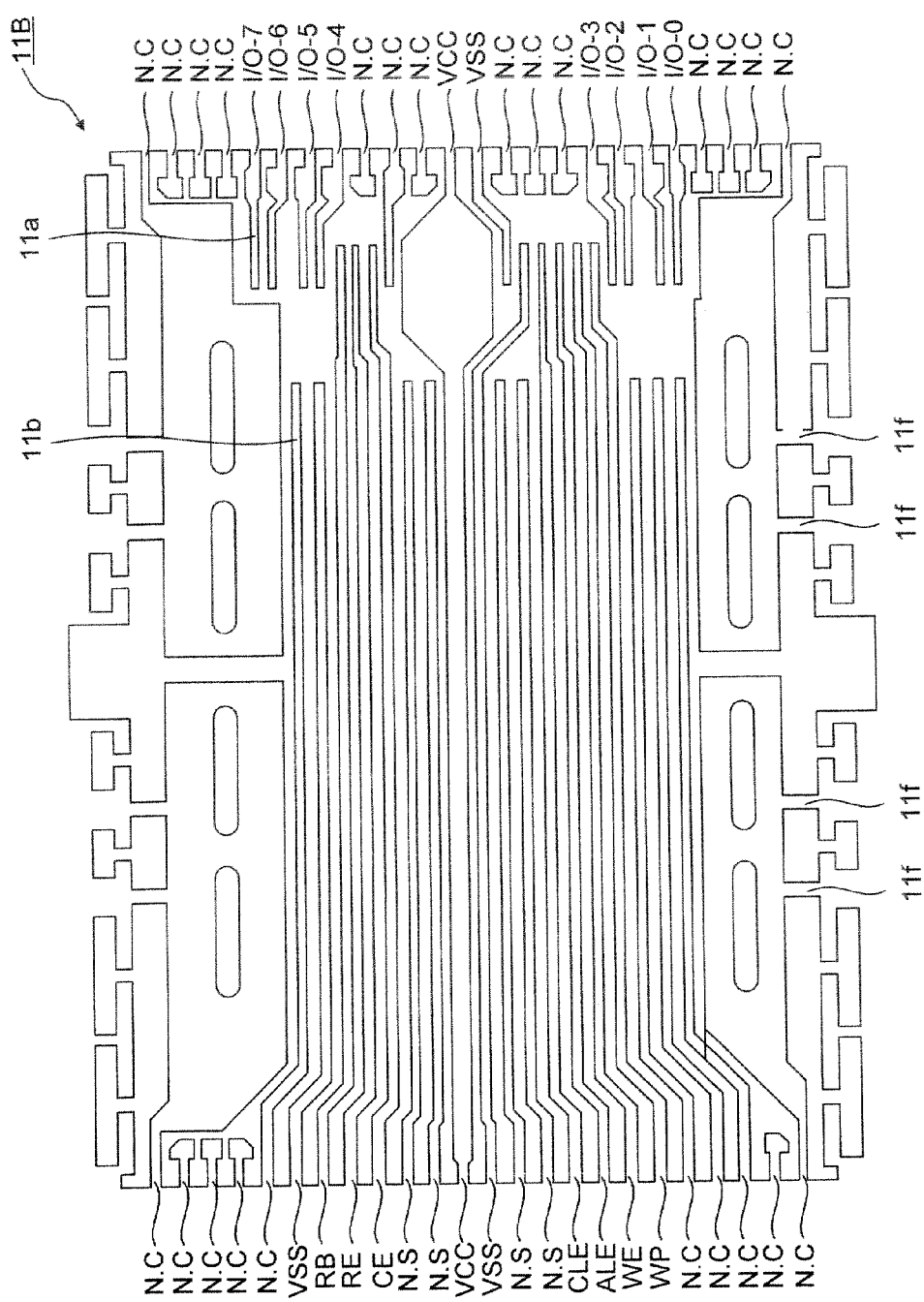
FIG. 7 is a plan view showing another lead frame to be employed in the stack-type semiconductor device according to the second embodiment of the present invention.

The lead frame is not limited to the embodiment relating to FIG. 6 and may be constructed from the one as shown in FIG. 7 FIG. 7 is a plan view showing another lead frame to be employed in the stack-type semiconductor device according to the second embodiment of the present invention. The external terminals VCC, VSS, I/O-0~I/O-7, RB, CE, RE, CLE, ALE, WE, WP are allotted in the same manner as the electrode pads 61 of the NAND-type flash memory 60. Herein, the reference numeral "N.C" designates the condition of nonuse. A lead frame 2B is illustrated in which the first inner leads 3 and the second inner leads 4 are divided into two sections, respectively so that the forefronts of the first inner leads 3 are arranged outside the forefronts of the second inner leads 4.

According to this embodiment, therefore, since the first bonding wires 15 and the second bonding wires 20 are wire-bonded to the fourth electrode pads 14 and the bonding pads 16,21 of the first inner leads 3 and the second inner leads 4 so that the intermediate portions of the wires 15, 20 are bonded to the stud bumps 19-17 which are formed on the corresponding third through first electrode pads 13-11, the length of the bonding wires 15, 20 can be shortened so as to lower the loop height of the bonding wires 15, 20. As a result, when the semiconductor chips 7-10 and the bonding wires 15, 20 are sealed by the sealing resin 5, the short circuit between the bonding wires 15 and 20 can be prevented due to the contact thereof when the wires 15 and 20 are flowed. In this point of view, the reliability of the stack-type semiconductor device can be enhanced.

In this embodiment, the stud bumps 17-19 of the electrode pads 11-13 are subsequently bonded so that the wire binding process is conducted only once. In the electrode pads 11-13, the wire deformation and the connecting failure due to the supersonic vibration at the wire bonding process can be prevented so that the intended stack-type semiconductor device can be manufactured easily and efficiently.

Then, a stack-type semiconductor device according to a third embodiment of the present invention will be described. In this embodiment, the stack-type semiconductor device is configured to be applied for a NAND type flash memory package as the second embodiment, and includes a memory chip (FIG. 5) and a lead frame (FIG. 6 or 7) which are similar to the ones in the second embodiment. However, the third embodiment is different in the connection of bonding wire from the second embodiment. Like reference numerals are imparted to like components throughout the drawings relating to the first through third embodiments. In this point of view, the explanation for like components will be omitted or simplified.

The stack-type semiconductor device in this embodiment includes a fifth, a 6a-th through 6d-th and a 7a-th through 7d-th bonding wires (not shown). The fifth bonding wires are configured in the same manner as the one in the second embodiment.

One ends of the fifth bonding wires are ball-bonded to the first through fourth electrode pads 11-14 to which the external terminals CE, WP, ALE, CLE of the memory chip 60 as shown in FIG. 5 are allotted, and other ends of the fifth bonding wires are stitch-bonded to the corresponding bonding pads of the second inner leads 4 as shown in FIG. 6.

One ends of the 6a-th bonding wires are ball-bonded to the fourth electrode pads 14 to which the external terminals VCC, VSS, I/O-0~I/O-7 of the memory chip 60 as shown in FIG. 5 are allotted, and other ends of the 6a-th bonding wires are stitch-bonded to the stud bumps 19 formed on the third electrode pads 13. One ends of the 6b-th bonding wires are ball-bonded to the stud bumps 19 formed on the third electrode pads 13 to which the external terminals VCC, VSS, I/O-0~I/O-7 of the memory chip 60 are allotted, and other ends of the 6b-th bonding wires are stitch-bonded to the stud bumps 18 formed on the second electrode pads 12. One ends of the 6c-th bonding wires are ball-bonded to the stud bumps 18 formed on the second electrode pads 12 to which the external terminals VCC, VSS, I/O-0~I/O-7 of the memory chip 60 are allotted, and other ends of the 6c-th bonding wires are stitch-bonded to the stud bumps 17 formed on the first electrode pads 11. One ends of the 6d-th bonding wires are ball-bonded to the stud bumps 17 formed on the first electrode pads 11 to which the external terminals VCC, VSS, I/O-0~I/O-7 of the memory chip 60 are allotted, and other ends of the 6d-th bonding wires are stitch-bonded to the corresponding bonding pads of the first inner leads 3 as shown in FIG. 6.

Therefore, the 6a-th through 6d-th bonding wires are stepwise wire-bonded to the first through fourth electrode pads and the bonding pads of the first inner leads 3, One ends of the 7a-th bonding wires are ball-bonded to the fourth electrode pads 14 to which the external terminals RB,RE of the memory chip 60 as shown in FIG. 5 are allotted, and other ends of the 7a-th bonding wires are stitch-bonded to the stud bumps 19 formed on the corresponding third electrode pads 13 to which the external terminals RB,RE are allotted One ends of the 7b-th bonding wires are ball-bonded to the stud bumps 19 formed on the third electrode pads 13 to which the external terminals RB, RE are allotted, and other ends of the 7b-th bonding wires are stitch-bonded to the stud bumps 18 formed on the corresponding third electrode pads 12 One ends of the 7c-th bonding wires are ball-bonded to the stud bumps 18 formed on the corresponding second electrode pads 12 to which the external terminals RB RE are allotted, and other ends of the 7c-th bonding wires are stitch-bonded to the stud bumps 17 formed on the corresponding first electrode pads 11. One ends of the 7d-th bonding wires are ball-bonded to the stud bumps 17 formed on the first electrode pads 11 to which the external terminals RB, RE are allotted, and other ends of the 7d-th bonding wires are stitch-bonded to the corresponding bonding pads of the second inner leads 4 as shown in FIG. 6.

Therefore, the 7a-th through 7d-th bonding wires are stepwise wire-bonded to the first through fourth electrode pads and the bonding pads of the second inner leads 4

In this embodiment, since the fifth, the 6a-th through 6d-th and the 7a-th through 7d-th bonding wires are stepwise wire-bonded to the first through fourth electrode pads 11-14 and the bonding pads 16,21 of the first inner leads 3 and the second inner leads 4, the length of the bonding wires can be shortened so as to lower the loop height of the bonding wires. As a result, when the semiconductor chips and the bonding wires are sealed by the sealing resin, the short circuit between the bonding wires can be prevented due to the contact thereof when the wires are flowed. In this point of view, the reliability of the stack-type semiconductor device can be enhanced.

Figure 8:
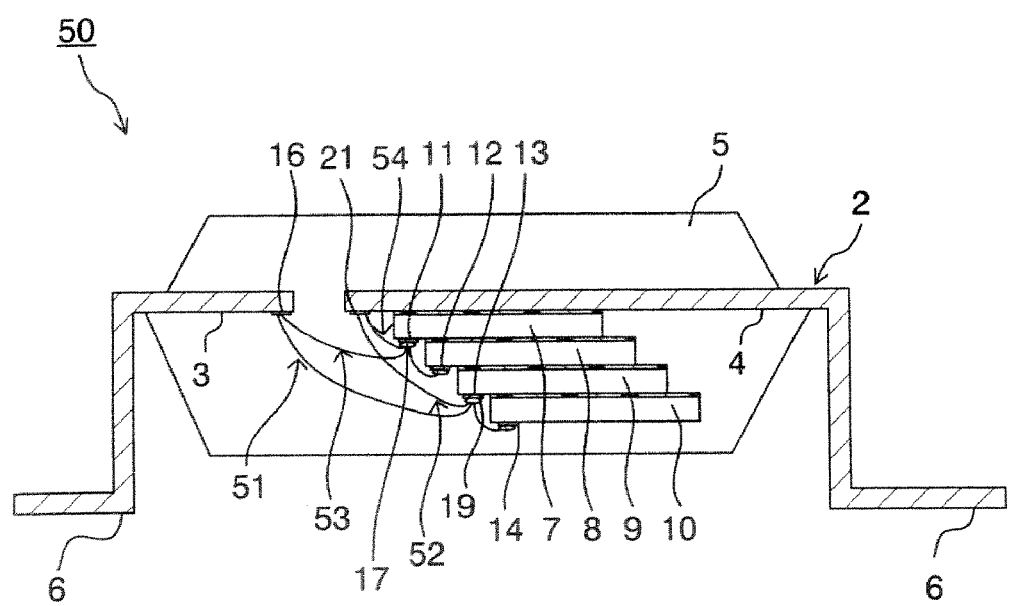
FIG. 8 is a cross-sectional view schematically showing the structure of a stack-type semiconductor device according to a fourth embodiment of the present invention.

Then, a stack-type semiconductor device according to a fourth embodiment of the present invention will be described with reference to FIG. 8. FIG. 8 is a cross-sectional view schematically showing the structure of the stack-type semiconductor device according to a fourth embodiment of the present invention The third embodiment is different in the connection of bonding wire from the first through fourth embodiment. Like reference numerals are Imparted to like components throughout the drawings relating to the first through third embodiments. In this point of view, the explanation for like components will be omitted or simplified. The stack-type semiconductor device 50 includes an eighth through eleventh bonding wires 51-54.

One ends of the eighth bonding wires 51 are ball-bonded to the fourth electrode pads 14, and other ends of the eighth bonding wires 51 are stitch-bonded to the first bonding pads 16 of the first inner leads 3, and the intermediate portions of the bonding wires 51 are stitch-bonded to the stud bumps 19 formed on the third electrode bumps 13.

One ends of the ninth bonding wires 52 are ball-bonded to the fourth electrode pads 14, and other ends of the ninth bonding wires 52 are stitch-bonded to the second bonding pads 21 of the second inner leads 4, and the intermediate portions of the bonding wires 52 are stitch-bonded to the stud bumps 19 formed on the third electrode bumps 13.

One ends of the tenth bonding wires 53 are ball-bonded to the second electrode pads 12, and other ends of the tenth bonding wires 53 are stitch-bonded to the first bonding pads 16 of the first inner leads 3, and the intermediate portions of the bonding wires 53 are stitch-bonded to the stud bumps 17 formed on the first electrode bumps 13.

One ends of the eleventh bonding wires 54 are ball-bonded to the second electrode pads 12, and other ends of the eleventh bonding wires 54 are stitch-bonded to the second bonding pads 21, and the intermediate portions of the bonding wires 54 are stitch-bonded to the stud bumps 17 formed on the first electrode bumps 11.

The eighth through eleventh bonding wires 51-54 and the first through fourth semiconductor chips 7-10, which are stacked and disposed on the lead frame, are sealed with the sealing resin 5 such as epoxy resin so as to constitute the stack-type semiconductor device 50 with TSOP structure. In this embodiment, the stack number of semiconductor chip is set to four, but may be set to another stack number, e.g., two, three or five and more.

In this embodiment, since the bonding wires 51-54 are wire-bonded to the fourth electrode pads 14 or the second electrode pads 12 and the bonding pads 16, 21 of the corresponding inner lead frames so that the intermediate portions of the wires are bonded to the stud bumps 19, 17 which are formed on the third electrode pads 13 and the first electrode pads 11, the length of the bonding wires 51-54 can be shortened so as to lower the loop height of the bonding wires. As a result, when sealed with the sealing resin, the short circuit between the bonding wires can be prevented due to the contact thereof when the wires are flowed. In this point of view, the reliability of the stack-type semiconductor device can be enhanced.

In this embodiment, the electrode pads 11-14 and the bonding pads 16, 21 are stepwise bonded so that the wire bonding process is conducted only once. Therefore, the wire deformation and the connecting failure due to the supersonic vibration at the wire bonding process can be prevented so that the intended stack-type semiconductor device can be manufactured easily and efficiently.

Although the present invention was described in detail with reference to the above examples, this invention is not limited to the above disclosure and every kind of variation and modification may be made without departing from the scope of the present invention. In the above-described embodiments, the semiconductor chips are stacked in turn under the face-down condition, but may be stacked and packaged under the face-up condition.

The present invention can be applied for various stack-type semiconductor device in which a plurality of semiconductor chips are stacked and mounted, e.g., for a BGA stack-type semiconductor device.

What is claimed is:

1. A stack-type semiconductor device, comprising:
a plurality of inner leads with bonding pads, including respective first inner circuit board leads and second inner circuit board leads, the first inner circuit board leads having ends extended in a first direction and the first and second inner circuit board leads being divided in a second direction orthogonal to the first direction so that forefronts of the second inner circuit board leads are arranged around a center in the second direction and forefronts of the first inner circuit board leads are arranged outside in the second direction;
a plurality of outer leads which are continued from the corresponding ones of the plurality of inner leads;
a first semiconductor chip which is mounted on the plurality of inner leads via a filmy insulating adhesive and includes first electrode pads along one side of a first element forming surface thereof so as to constitute a one-sided pad structured semiconductor chip; and
a second semiconductor chip which is mounted stepwise on the first semiconductor chip, has the same size as the first semiconductor chip and includes second electrode pads along one side of a second element forming surface thereof in the same side of the one side of the first element forming surface so as to constitute another one-sided pad structured semiconductor chip;

a plurality of bonding wires sequentially connecting the bonding pads, the first electrode pads and the second electrode pads as a whole; and a sealing resin for sealing the first semiconductor chip, the second semiconductor chip and the bonding wires.

2. The stack-type semiconductor device as set forth in claim 1, wherein one ends of the bonding wires are ball-bonded to the second electrode pads and other ends of the bonding wires are stitch-bonded to the bonding pads, and the intermediate portions of the bonding wires are stitch-bonded to stud bumps formed on the first electrode pads.

3. The stack-type semiconductor device as set forth in claim 2, wherein other stud bumps are stacked on the corresponding stud bumps to which the bonding wires are stitched.

4. The stack-type semiconductor device as set forth in claim 2, wherein the plurality of inner leads and the plurality of outer leads constitute a lead frame, whereby the stack-type semiconductor device constitutes a TSOP (Thin Small Outline Package) structured semiconductor device.

5. The stack-type semiconductor device as set forth in claim 2, wherein the plurality of inner leads and the plurality of outer leads constitute a lead frame, and at least one of the first semiconductor chip and the second semiconductor chip constitutes a memory chip so that the stack-type semiconductor device constitutes a NAND-type flash memory.

6. The stack-type semiconductor device as set forth in claim 1, wherein one ends of the bonding wires are ball-bonded to the bonding pads and other ends of the bonding wires are stitch-bonded to the second electrode pads, and the intermediate portions of the bonding wires are stitch-bonded to stud bumps formed on the first electrode pads.

7. The stack-type semiconductor device as set forth in claim 6, wherein other stud bumps are stacked on the corresponding stud bumps to which the bonding wires are stitched.

8. The stack-type semiconductor device as set forth in claim 6, wherein the plurality of inner leads and the plurality of outer leads constitute a lead frame, whereby the stack-type semiconductor device constitutes a TSOP (Thin Small Outline Package) structured semiconductor device.

9. The stack-type semiconductor device as set forth in claim 6, wherein the plurality of inner leads and the plurality of outer leads constitute a lead frame, and at least one of the first semiconductor chip and the second semiconductor chip constitutes a memory chip so that the stack-type semiconductor device constitutes a NAND-type flash memory.

10. The stacked type semiconductor device as set forth in claim 1, wherein the plurality of inner leads have respective first inner leads have the bonding pads so that the first semiconductor chip and the second semiconductor chip are mounted on the first inner leads and so that the bonding pads, the first electrode pads and the second electrode pads are sequentially connected with one another by the bonding wires as a whole.

11. The stacked type semiconductor device as set forth in claim 1, wherein the first semiconductor chip and the second semiconductor chip are shaped rectangularly so that the first inner leads are elongated under the first semiconductor chip and both ends of the first inner leads are exposed from both edges opposite to one another of the first semiconductor chip in the first direction and so that the first inner leads continue to one ends of the outer leads respectively through the sealing resin.

12. The stacked type semiconductor device as set forth in claim 1, wherein the second inner leads are separated from the first inner leads respectively so that no semiconductor chip is mounted on the second inner leads but the first semiconductor chip and the second semiconductor chip are electrically connected with the second inner leads, wherein the second inner leads are sealed by the sealing resin so as to continue to the other ends of the outer leads respectively.

* * * * *